United States Patent
Yamagishi et al.

(10) Patent No.: US 7,910,282 B2
(45) Date of Patent: Mar. 22, 2011

(54) COPOLYMER FOR SEMICONDUCTOR LITHOGRAPHY AND PRODUCING METHOD THEREOF, AND COMPOSITION

(75) Inventors: Takanori Yamagishi, Funabashi (JP); Takayoshi Okada, Ichihara (JP); Satoshi Yamaguchi, Ichihara (JP); Kiyomi Miki, Ichihara (JP)

(73) Assignee: Maruzen Petrochemical Co., Ltd., Tokyo (JP)

( * ) Notice: Subject to any disclaimer, the term of this patent is extended or adjusted under 35 U.S.C. 154(b) by 425 days.

(21) Appl. No.: 11/587,592

(22) PCT Filed: Apr. 28, 2005

(86) PCT No.: PCT/JP2005/008168
§ 371 (c)(1),
(2), (4) Date: Oct. 25, 2006

(87) PCT Pub. No.: WO2005/105869
PCT Pub. Date: Nov. 10, 2005

(65) Prior Publication Data
US 2008/0114139 A1 May 15, 2008

(30) Foreign Application Priority Data
Apr. 30, 2004 (JP) ................. 2004-136565

(51) Int. Cl.
*G03F 7/004* (2006.01)
*G03F 7/30* (2006.01)
(52) U.S. Cl. ............ 430/270.1; 430/326; 430/905; 430/910; 526/313; 526/320
(58) Field of Classification Search ........ 430/270.1, 430/326, 905, 910; 526/313, 320
See application file for complete search history.

(56) References Cited

U.S. PATENT DOCUMENTS

| 5,625,020 A * | 4/1997 | Breyta et al. | 526/329.2 |
| 6,156,477 A * | 12/2000 | Motomi et al. | 430/270.1 |
| 6,277,546 B1 * | 8/2001 | Breyta et al. | 430/322 |
| 6,365,321 B1 * | 4/2002 | Chen et al. | 430/270.1 |
| 6,653,044 B2 * | 11/2003 | Takeda et al. | 430/270.1 |

FOREIGN PATENT DOCUMENTS

| JP | 10 251315 | 9/1998 |
| JP | 10 274852 | 10/1998 |
| JP | 2001-109153 | 4/2001 |
| JP | 2001 151823 | 6/2001 |
| JP | 2002-194029 | 7/2002 |
| JP | 2002-201210 | 7/2002 |
| JP | 2002-229220 | 8/2002 |
| JP | 2003-213721 | 7/2003 |
| JP | 2003-306514 | 10/2003 |
| JP | 2004 300441 | 10/2004 |
| JP | 2005-275072 | 10/2005 |
| JP | 2005-309376 | 11/2005 |
| WO | 99 40132 | 8/1999 |
| WO | 99 50322 | 10/1999 |

* cited by examiner

*Primary Examiner* — John S Chu
(74) *Attorney, Agent, or Firm* — Oblon, Spivak, McClelland, Maier & Neustadt, L.L.P.

(57) ABSTRACT

In order to improve a resist pattern shape in a semiconductor lithography process, which is a factor largely affecting on a processing precision, an integration degree and yield, a copolymer for semiconductor lithography where a composition of a hydroxyl group-containing repeating unit in a low molecular weight region is controlled, and a method of producing the same are provided.

According to the invention, in a copolymer for semiconductor lithography, which is obtained by copolymerizing a monomer having a hydroxyl group and a monomer having no hydroxyl group, when a copolymer of which composition of a hydroxyl group-containing repeating unit is controlled is used, the object can be achieved.

8 Claims, No Drawings

COPOLYMER FOR SEMICONDUCTOR LITHOGRAPHY AND PRODUCING METHOD THEREOF, AND COMPOSITION

TECHNICAL FIELD

The present invention relates to a copolymer suitable for forming a coating film, such as a resist film used in a semiconductor lithography process, an anti-reflective film or the underlayer film of a multi-layered resist, to a method for the production thereof, and to a composition containing said copolymer for a semiconductor lithography.

BACKGROUND ART

In a lithography process employed for producing a semiconductor, formation of a finer pattern is increasingly required so as to match with an elevated degree of integration. For formation of a finer pattern, it is essential that the length of the light wave beaming from an exposure light source be made as shorter as possible. At present, a lithography using a krypton fluoride (KrF) excimer laser (wavelength: 248 nm) is becoming mainstream, and a lithography using an argon fluoride (ArF) excimer laser (wavelength: 193 nm), which enables a line width of 100 nm or less, is expected to come into practical use. Furthermore, various kinds of radiation lithography technologies using a short wavelength, such as fluorine dimer ($F_2$) excimer laser light (wavelength: 157 nm), extreme-UV rays, X-rays or electron beams, are in a developmental stage.

In semiconductor lithography processes, in a resist film where by making use of a variation of the solubility to an alkali developer under an action of acid, a resist pattern for transferring on a substrate is formed, and in an upper layer of the resist film or a lower layer of the resist film, various kinds of coating films are used. It can be cited that as a coating film applied to, for instance, a lower layer, that is, as a lower layer film, an anti-reflective film that suppresses light from being reflected from a substrate to accurately form a fine resist pattern, a flattening film that is used in a lower layer of a resist to make irregularity formed on a surface of the substrate flat when a resist pattern is further formed on the substrate thereon a pattern is formed, and an underlayer film or the like in a multi-layered resist that is used to transfer a resist pattern owing to dry etching.

These coating films can be formed in such a manner that a coating solution where a copolymer for lithography, which has a function of each of the coating films, other additives are dissolved in an organic solvent is prepared, the coating solution is coated on a substrate according to a method such as a spin coating method, and as needs arise the solvent is removed by heating or the like. In a copolymer used for lithography at that time, in addition to the optical properties that are demanded for a resist film and an anti-reflective film, chemical properties, coating properties and physical properties such as the adhesiveness to the substrate or the lower layer film, a fundamental property as a coating copolymer such that foreign matters that disturb the formation of a fine pattern are not present is demanded.

As a resist copolymer that is a copolymer used in a resist film, there are a negative type copolymer in which owing to an action of acid the solubility to an alkali developer is decreased and a positive type copolymer in which owing to an action of acid the solubility to an alkali developer is increased. The positive type resist copolymer is constituted necessarily including a repeating unit having a polar group that improves the adhesiveness to a semiconductor substrate and an underlayer film, or controls the solubility to a lithography organic solvent or an alkali developer and a repeating unit having a structure where a nonpolar substituent group is dissociated by acid to develop a polar group soluble in an alkali developer, and, as needs arise, a repeating unit having an acid-stable nonpolar substituent group for controlling the solubility to the lithography organic solvent and the alkali developer.

Specific examples of such a positive type resist copolymer include, in the KrF lithography process, a copolymer that includes a repeating unit derived from hydroxystyrene and a repeating unit derived from acid-decomposable alkoxystyrene; a copolymer that includes a repeating unit derived from hydroxystyrene and a repeating unit derived from an acid-decomposable alkyl (meth) acrylate; and a polymer wherein the hydroxystyrene-derived repeating unit has been partially protected with an acetal are known. In the ArF lithography process, a copolymer or the like that includes a repeating unit derived from (meth)acrylate substituted by a hydroxyalkyl group and a repeating unit derived from acid-decomposable alkyl (meth)acrylate is known.

A repeating unit that has a hydroxyl group is readily dissolved in an alkali developer. Accordingly, when the repeating unit that has a hydroxyl group is used as for instance a resist film, a resist pattern can be appropriately smoothed and the roughness can be suppressed low and so on. Furthermore, the solubility to the alkali developer is different depending on a molecular weight of a copolymer as well. That is, in general, the larger the molecular weight thereof is, the smaller the solubility thereof is, and the smaller the molecular weight thereof is, the larger the solubility thereof is. Accordingly, the higher a composition of a repeating unit that is small in the molecular weight and has the hydroxyl group is, the larger the solubility to the alkali developer is. In general, when a copolymer is designed, by taking such a nature into consideration, a composition of the repeating unit having a hydroxyl group and a molecular weight thereof are designed. Normally, a copolymer has a molecular weight distribution, and a composition of the polymer is different between a high molecular weight component and a low molecular weight component (hereinafter, referred to as "composition in a molecular weight direction"). Thus, when a composition of a hydroxyl group is different in a molecular weight direction, a pattern as designed cannot be depicted. For instance, when a repeating unit that contains a hydroxyl group in a low molecular weight region is contained much, a top shape of a pattern tends to be rounded, by contrast, when the repeating unit that contains a hydroxyl group in a low molecular weight region is contained less, the top shape of a pattern tends to be angulated or rougher. Such a problem is becoming incapable of neglecting as a pattern becomes finer.

As a copolymer of which composition in a molecular weight direction is controlled, an example that is a copolymer containing an alicyclic structure and a lactone structure, in which a lactone composition in a molecular weight direction is controlled within ±10%, is known (patent literature 1). Furthermore, an example that is a copolymer between a monomer having an alicyclic structure and p-acetoxystyrene, in which a p-acetoxystyrene composition in a molecular weight direction is controlled within ±10%, is known (patent literature 2). The technologies each have proposed a method where, in a two-component copolymer that has an alicyclic structure and a lactone structure or a monomer having an alicyclic structure and p-acetoxystyrene, in order to improve the solubility to a solvent, a lactone or p-acetoxystyrene composition is controlled.

As a similar technology, a technology where a monomer having a polar group such as a hydroxyl group and a monomer not containing a polar group are supplied in a heated polymerization solvent together with a polymerization initiator and a polymerization catalyst to polymerize is known (patent literatures 3 and 4). The technology has proposed, in order to improve the adhesiveness with a substrate, a method of polymerizing a monomer having a polar group-containing alicyclic functional group. However, in all of the above-described technologies, the relationship between a composition control in a low molecular weight region and the lithography characteristics is not disclosed.

In a polymerization solution after a polymerization reaction, other than a copolymer, there are low molecular weight impurities such as an unreacted monomer and impurities derived from the polymerization initiator or the polymerization catalyst. The low molecular weight impurities are unfavorable because, in the semiconductor lithography process, the impurities volatilize to stick to an optical system of an exposure device, generate a defect in a pattern or cause a variation in the nature of the copolymer during storage. In this connection, a method is known where a polymerization solution is mixed with a poor solvent to precipitate a copolymer as a solid content (hereinafter, referred to as "reprecipitation") or a precipitated copolymer is washed with a poor solvent (hereinafter referred to as "washing"), and thereby the copolymer is refined (hereinafter referred to "refining") owing to solubility difference to the poor solvent of the copolymer and the low molecular weight impurities. The refining process is applied in almost all of the above referenced literatures. Other than the above, a method where a composition of the solvent is controlled so that a residual monomer may be 5% or less (patent literature 5), a method where a copolymer-containing slurry dispersed in a solvent is heated (patent literatures 6 and 7) and a method where, by use of a poor solvent, reprecipitation or rinse is applied to remove an insoluble content to improve the solvent solubility (patent literature 8) or the like are known.

However, in all of the technologies, the poor solvent that is brought into contact with the copolymer is, in each of reprecipitation and/or washing step, only a polar solvent having a hydroxyl group or only a nonpolar solvent that does not have a hydroxyl group. In the refining step, since the solubility difference between a low molecular weight region of the copolymer and the low molecular weight impurities to be removed is small, the low molecular weight region of the copolymer is partially removed. Accordingly, there are problems in that, when a polar solvent having a hydroxyl group is used to refine, a composition of a hydroxyl group-containing repeating unit in the low molecular weight region of the polymer is lowered, and when a nonpolar solvent is used to refine, a composition of a hydroxyl group-containing repeating unit in the low molecular weight region of the polymer is raised.

From these backgrounds, in a copolymer for semiconductor lithography, which is obtained by copolymerizing a monomer having a hydroxyl group and a monomer that does not have a hydroxyl group, only a polymer where a composition of a hydroxyl group-containing repeating unit in the low molecular weight region is deviated from an average composition is known. Accordingly, a problem relating to a shape of a lithography pattern such as mentioned above is not yet overcome.

Patent literature 1: WO99/50322
Patent literature 2: JP-A 2001-151823
Patent literature 3: JP-A 2002-194029
Patent literature 4: JP-A 2003-306514
Patent literature 5: JP-A 2001-109153
Patent literature 6: JP-A 2002-201210
Patent literature 7: JP-A 2002-229220
Patent literature 8: JP-A 2003-213721

DISCLOSURE OF INVENTION

Problem that the Invention is to Solve

The object of the present invention is to provide a copolymer for semiconductor lithography where in order to improve a resist pattern shape in a semiconductor lithography process, which is a large factor that largely affects on processing accuracy to determine an integration degree and a yield, a composition of a hydroxyl group-containing repeating unit in a low molecular weight region is controlled, and a producing method thereof.

Means for Solving the Problem

The present inventors, after studying hard, found that, in a copolymer for semiconductor lithography, which is obtained by copolymerizing a monomer having a hydroxyl group and a monomer having no hydroxyl group, when a copolymer is used where a molar composition of a hydroxyl group-containing repeating unit in a low molecular weight region is controlled, the above object can be achieved, and thereby the invention came to completion. In general, a kind of a copolymer, an average composition and an average molecular weight are controlled to control a pattern shape. However, it was found by the invention that, when only the above-mentioned factors are controlled, a pattern shape as designed could not be obtained. That is, when a composition of a hydroxyl group in a molecular weight direction is controlled, a pattern as designed, which can respond to a demand for miniaturization, can be formed.

That is, the invention, in a copolymer for semiconductor lithography, which is obtained by copolymerizing a monomer having a hydroxyl group and a monomer having no hydroxyl group, provides a copolymer for semiconductor lithography where a molar composition of a hydroxyl group-containing repeating unit in a low molecular weight region corresponding to 5% of a copolymer total peak in gel permeation chromatography is within ±10% of an average molar composition of the hydroxyl group-containing repeating unit in a total copolymer and a composition for semiconductor lithography, which contains the copolymer.

Furthermore, the invention provides a producing method of a copolymer for semiconductor lithography, in which a copolymer for semiconductor lithography, which is obtained by copolymerizing a monomer having a hydroxyl group and a monomer having no hydroxyl group, is obtained by undergoing, after a polymerization reaction, a step of bringing an obtained copolymer into contact with a polar solvent having a hydroxyl group to reprecipitate or wash; and a step of bringing the obtained copolymer into contact with a nonpolar solvent having no hydroxyl group to reprecipitate or wash.

ADVANTAGE OF THE INVENTION

According to the invention, with a copolymer in which a composition of a hydroxyl group-containing repeating unit of a low molecular weight region, which largely affects particularly on a pattern shape, is controlled, a fine pattern excellent in the rectangularity can be formed and thereby a dense and fine integrated circuit can be formed.

BEST MODE FOR CARRYING OUT THE INVENTION

A copolymer for semiconductor lithography according to the invention necessarily includes, in order to improve the adhesiveness with a semiconductor substrate or an underlayer film and to control the solubility to a lithography organic solvent or an alkali developer, at least a hydroxyl group-containing repeating unit. Furthermore, the copolymer for semiconductor lithography according to the invention is constituted including a repeating unit that does not contain a hydroxyl group, which has functions necessary for a resist layer, an underlayer film of a multi-layer resist, an anti-reflection film and so on. Accordingly, the copolymer for semiconductor lithography according to the invention can be obtained by copolymerizing at least one kind of a monomer having a hydroxyl group and at least one kind of a monomer having no hydroxyl group.

When the copolymer is used in a positive type resist, the copolymer necessarily includes, at least, a hydroxyl group-containing repeating unit (A) that improves the adhesiveness with a semiconductor substrate or an underlayer film or controls the solubility to a lithography organic solvent or an alkali developer; a repeating unit (B) that has a structure where a substituent group having no hydroxyl group is dissociated by acid to develop a polar group soluble in an alkali developer; and, as needs arise, a repeating unit (C) having a polar group other than a hydroxyl group or an acid-stable repeating unit (D) not having a polar group such as a hydroxyl group to control the adhesiveness and the solubility.

The hydroxyl group-containing repeating unit (A) that controls the adhesiveness or the solubility can be introduced by copolymerizing a monomer having a hydroxyl group. As such monomers, for instance, compounds having a phenolic hydroxyl group, an alcoholic hydroxyl group, a carboxyl group, a hydroxyhalogenoalkyl group or the like can be cited. Specifically, 1) hydroxystyrenes, 2) hydroxyhalogenoalkyl styrenes, 3) carboxylic acids having an ethylenic double bond, 4) hydroxylkyl esters of 3), 5) hydroxyhalogenoalkyl esters of 3) and so on can be cited. Here, as an alkyl group in a hydroxyalkyl or hydroxyhalogenoalkyl portion in 2), 4) and 5), a linear, branched or cyclic alkyl group having 1 to 20 carbon atoms can be cited. Furthermore, as a halogeno group, a fluoro group, a chloro group or a bromo group can be cited. Still furthermore, as a carboxylic acid having an ethylenic double bond, (meth)acrylic acid is preferable.

Specific examples of such monomer include 1) hydroxystyrenes such as p-hydroxystyrene, m-hydroxystyrene, p-hydroxy-α-methylstyrene and so on; 2) hydroxyhalogenoalkyl-styrenes such as p-(2-hydroxy-1,1,1,3,3,3-hexafluoro-2-propyl)styrene and so on; 3) carboxylic acids having an ethylenic double bond such as acrylic acid, methacrylic acid, maleic acid, fumaric acid, α-trifluoromethylacrylic acid, 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate and so on; 4) hydroxyalkylesters where a carboxyl group of carboxylic acid having an ethylenic double bond is substituted by a hydroxyalkyl group such as a hydroxymethyl group, a hydroxyethyl group, a hydroxypropyl group, a hydroxy-8-tricyclo[5.2.1.0$^{2,6}$]decanyl group, a 3-hydroxy-1-adamantyl group or the like; and 5) hydroxyhalogenoalkyl esters where a carboxylic group of carboxylic acid having an ethylenic double bond is substituted by a (2-hydroxy-1,1,1,3,3,3-hexafluoro-2-propyl)methyl group, a 5-(2-hydroxy-1,1,1,3,3,3-hexafluoro-2-propyl) methyl-2-norbornyl group, a 5-(2-hydroxy-1,1,1,3,3,3-hexafluoro-2-propyl)methyl-3-norbornyl group, a 5-(2-hydroxy-1,1,1,3,3,3-hexafluoro-2-propyl)-2-norbornyl group, a 2-(4-(2-hydroxy-1,1,1,3,3,3-hexafluoro-2-propyl) cyclohexyl)-1,1,1,3,3,3-hexafluoropropyl group and so on.

The repeating unit (B) that has a structure where a substituent group having no hydroxyl group is dissociated by acid to develop a polar group soluble in an alkali developer can be obtained by polymerizing a monomer having a structure that is decomposed by acid to be alkali soluble or, after a monomer having an alkali soluble structure is polymerized, by protecting the alkali soluble group with a group (acid dissociative group) that is not dissolved in alkali but is dissociated by acid.

As acid dissociative group having no hydroxyl group, saturated hydrocarbon groups such as a tert-butyl group, a tert-amyl group, a 1-methyl-1-cyclopentyl group, a 1-ethyl-1-cyclopentyl group, a 1-methyl-1-cyclohexyl group, a 1-ethyl-1-cyclohexyl group, a 2-methyl-2-adamantyl group, a 2-ethyl-2-adamantyl group, a 2-propyl-2-adamantyl group, a 2-(1-adamantyl)-2-propyl group, a 8-methyl-8-tricyclo[5.2.1.0$^{2,6}$]decanyl group, a 8-ethyl-8-tricyclo[5.2.1.0$^{2,6}$]decanyl group, a 8-methyl-8-tetracyclo[4.4.0.1$^{2,5}$.1$^{7,10}$]dodecanyl group, a 8-ethyl-8-tetracyclo[4.4.0.1$^{2,5}$.1$^{7,10}$]dodecanyl group and the like; and oxygen-containing hydrocarbon groups such as a 1-methoxyethyl group, a 1-ethoxyethyl group, a 1-iso-propoxyethyl group, a 1-n-butoxyethyl group, a 1-tert-butoxyethyl group, a 1-cyclopentyloxyethyl group, a 1-cyclohexyloxyethyl group, a 1-tricyclo[5.2.1.0$^{2,6}$]decanyloxyethyl group, a methoxymethyl group, a ethoxymethyl group, an iso-propoxymethyl group, a n-butoxymethyl group, a tert-butoxymethyl group, a cyclopentyloxymethyl group, a cyclohexyloxymethyl group, a tricyclo[5.2.1.0$^{2,6}$] decanyloxymethyl group, a tetrahydropyranyl group, a tert-butoxycarbonyl group and the like can be cited. Here, as a saturated hydrocarbon group, a linear, branched or an alicyclic hydrocarbon group having 1 to 20 carbon atoms is preferable. Furthermore, as an oxygen-containing hydrocarbon group, a linear, branched or an alicyclic hydrocarbon group having an ether bond or an ester bond having 2 to 24 carbon atoms in total.

As a monomer that has an acid dissociative group, a compound where a hydroxyl group of a compound shown in for instance (A) is protected with an acid dissociative group that does not have the hydroxyl group or the like can be cited. Furthermore, when after a monomer having an alkali soluble group that is not protected is polymerized, the alkali soluble group is protected with an alkali insoluble acid dissociative group, the monomer having the alkali soluble group is polymerized as it is, followed by, in the presence of an acid catalyst, reacting with a compound that gives rise to an alkali-insoluble substituent group such as vinyl ether or halogenated alkyl ether. As an acid catalyst that is used in a reaction, p-toluene sulfonic acid, trifluoroacetic acid, a strong acidic ion exchange resin and so on can be cited.

The repeating unit (C) having a polar group other than a hydroxyl group for controlling the adhesiveness and the solubility can be introduced by copolymerizing a monomer having a polar group other than a hydroxyl group. As an example of such a monomer, a compound where hydroxyl group of a monomer having a hydroxyl group exemplified in (A) is substituted by a substitution group having a polar structure such as, in addition to maleic anhydride and maleimide, lactone, acid anhydride, imide, nitrile, carbonate or the like can be cited. A particularly preferable polar substituent group is a substituent group containing a lactone structure. Examples of substituent group having a lactone structure include substituent groups containing a lactone structure having 4 to 20 carbon atoms in total such as γ-butyrolactone, γ-valerolactone, δ-valerolactone, 1,3-cyclohexane carbolactone, 2,6-norbornane carbolactone, 4-oxatricyclo[5.2.1.0$^{2,6}$]decane-3-one, mevaloic acid δ-lactone and so on, and ester compounds where by the substituent group a carboxyl group of carboxylic acids having an ethylenic double bond such as acrylic acid, methacrylic acid, maleic acid, fumaric acid, α-trifluoromethyl acrylic acid, 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate or the like is substituted can be cited.

The acid stable repeating unit (D) not having a polar group such as a hydroxyl group can be introduced by copolymerizing a monomer that has an acid stable substituent group that does not contain a polar group. Examples of such a compound include aromatic compounds such as styrene, α-methyl styrene, p-methyl styrene, indene or the like; and ester compounds where a carboxyl group of carboxylic acids having an ethylenic double bond such as acrylic acid, methacrylic acid, maleic acid, fumaric acid, α-trifluoromethyl acrylic acid, 5-norbornene-2-carboxylic acid, 2-trifluoromethyl-5-norbornene-2-carboxylic acid, carboxytetracyclo[4.4.0.1$^{2,5}$.1$^{7,10}$]dodecyl methacrylate and so on is substituted by a saturated hydrocarbon group having 1 to 20 carbon atoms such as a methyl group, an ethyl group, an iso-propyl group, a cyclopentyl group, a cyclohexyl group, a 1-ethyl-1-cyclohexyl group, a 2-methyl-2-adamantyl group, a 2-ethyl-2-adamantyl group, a 2-propyl-2-adamantyl group, a 2-(1-adamantyl)-2-propyl group, a 8-methyl-8-tricyclo[5.2.1.0$^{2,6}$]decanyl group, a 8-ethyl-8-tricyclo[5.2.1.0$^{2,6}$]decanyl group, a 8-methyl-8-tetracyclo[4.4.0.1$^{2,5}$.1$^{7,10}$]dodecanyl group, a 8-ethyl-8-tetracyclo[4.4.0.1$^{2,5}$.1$^{7,10}$]dodecanyl group and the like.

The copolymer according to the invention includes the repeating units (A) and (B) indispensably and, as needs arise, (C) and (D) and may include at least one kind or tow kinds of each of these. A composition ratio of each of the respective repeating units in an obtained resist polymer can be selected within a range that does not disturb the fundamental performance thereof. That is, in general, a composition ratio of the repeating unit (A) is preferably in the range of 10 to 90 mole percent and more preferably in the range of 10 to 80 mole percent. Furthermore, a composition ratio of the repeating unit (B) is preferably in the range of 10 to 70 mole percent and more preferably in the range of 10 to 60 mole percent. A composition ratio of the repeating unit (C) is preferably in the range of 0 to 70 mole percent and more preferably in the range of 0 to 60 mole percent. A composition ratio of the repeating unit (D) is preferably in the range of 0 to 40 mole percent and more preferably in the range of 0 to 30 mole percent.

When the copolymer for semiconductor lithography of the invention is used as an underlayer film of a multilayer resist, a repeating unit (A') for improving the adhesiveness with a semiconductor substrate and for reacting with a compound having a bifunctional or more reactive group to crosslink and a repeating unit (B') for controlling the solubility to a lithography organic solvent are necessarily contained. As the repeating unit (A'), the repeating unit (A) can be preferably used and, as the repeating unit (B'), the repeating unit (D) can be preferably used. Furthermore, a copolymer for an underlayer film of the multilayer resist may include the repeating unit (B) and/or (C). When the copolymer for semiconductor lithography is used as an anti-reflection film, a structure that absorbs radiation irradiated in the lithography process is necessarily included in the repeating unit (A) and/or (D).

The structure that absorbs the radiation differs depending on a wavelength of the radiation used. For instance, a naphthalene skeleton or anthracene skeleton is preferable for KrF excimer laser and a benzene skeleton is preferable for ArF laser. Examples of a polymerizable compound that imparts a repeating unit having the structure include styrenes such as styrene, α-methylstyrene, p-methylstyrene, p-hydroxystyrene, m-hydroxystyrene and so on derivatives thereof; and aromatic group-containing esters having an ethylenic double bond such as substituted or unsubstituted phenyl (meth)acrylate, substituted or unsubstituted naphthalene (meth)acrylate, substituted or unsubstituted anthracene methyl (meth)acrylate and so on. The repeating unit having a structure that absorbs radiation, depending on the presence of a polar group, may be contained in either one of the repeating unit (A) or (D) or in both thereof. A composition ratio of the repeating unit having a structure that absorbs radiation is preferably selected in the range of 10 to 100 mole percent.

A copolymer for semiconductor lithography of the invention is a copolymer obtained by copolymerizing the above-exemplified monomer having a hydroxyl group and a monomer having no hydroxyl group, in which a molar composition of a hydroxyl group-containing repeating unit in a low molecular weight region corresponding to an area of 5% of a copolymer total peak obtained by gel permeation chromatography (GPC) is within ±10% of an average molar composition of the hydroxyl group-containing repeating unit in a whole of the copolymer. That is, with an average molar composition as a %, the molar composition falls in the range of 0.90 a to 1.10 a. When the molar composition is higher than the range, since a component that is too high in the solubility to an alkali developer is present together, a top shape of a pattern is rounded. On the contrary, when the molar composition is lower than the range, since a component that is too low in the solubility to an alkali developer is present together, a top shape is angulated or becomes coarser to be incapable of obtaining a pattern high in the rectangularity. That is, a demand for miniaturization of the pattern cannot be satisfied.

Here, a composition of the hydroxyl group-containing repeating unit in a molecular weight direction can be obtained by subjecting a solution separated by the GPC to infrared spectroscopy (IR), nuclear magnetic resonance (NMR) or the like to analyze. However, preferably, after a solution separated by the GPC is sprayed on a rotating disc and dried, with the disc rotating, FT-IR is applied, and thereby, a composition in a molecular weight direction can be analyzed in detail. An average composition of the hydroxyl group-containing repeating unit can be analyzed by means of the IR, NMR and so on. However, preferably, $^{13}$C-NMR can be applied to obtain more accurate information.

A producing method of the invention of a copolymer is not particularly restricted, as far as it can produce a copolymer where a mole composition of a hydroxyl group-containing repeating unit in a low molecular weight region corresponding to an area of 5% of a copolymer total peak obtained in the GPC is within ±10% of an average molar composition of the hydroxyl group-containing repeating unit in a whole of the copolymer. However, in order to readily produce the copolymer like this, a method described below can be preferably applied to produce.

In the beginning, as a method of polymerizing a copolymer of the invention, it is preferable that, in the presence of a polymerization solvent, by use of a polymerization initiator, at least two kinds of polymerizable compounds selected from above-described monomer groups are radical polymerized to obtain.

A polymerization initiator used in a polymerization reaction is not particularly restricted, as far as it can be generally used as a radical generator. For instance, azo compounds such as 2,2'-azobisisobutylo nitrile, 2,2'-azobis(2-methylbutyloni-trile), 2,2'-azobisisobutyric acid dimethyl, 1,1'-azobis(cyclohexanone-1-carbonitrile), 4,4'-azobis(4-cyanovaleric acid) and so on; and organic peroxide compounds such as decanoyl peroxide, lauroyl peroxide, benzoyl peroxide, bis(3,5,5-trimethylhexanoyl)peroxide, succinic peroxide, tert-butylperoxy-2-ethylhexanoate and so on can be used singularly or in a combination thereof.

Other than the above, a thiol compound can be used as a chain transfer agent. As such thiol compounds, known thiol compounds such as dodecyl mercaptan, mercaptoethanol, mercaptopropanol, mercaptoacetic acid, mercaptopropionic acid, 4,4-bis(trifluoromethyl)-4-hydroxy-1-mercaptobutane and so on can be used singularly or in a combination thereof.

Usage amounts of the polymerization initiator and the chain transfer agent are different depending on producing conditions such as kinds of a raw material monomer, a polymerization initiator and a chain transfer agent that are used in a polymerization reaction, a polymerization temperature, a polymerization solvent, a polymerization method, a refining condition and so on. Accordingly, the usage amounts cannot be specified in a clear-cut manner, but optimum amounts for obtaining a desired molecular weight are used. In general, when a weight-average molecular weight of a copolymer is too high, the solubility to a solvent that is used during the formation of a film and an alkali developer becomes low; on the other hand, when a weight-average molecular weight is too low, film properties are deteriorated. Accordingly, the weight-average molecular weight is preferably controlled so as to be in the range of 2,000 to 40,000 and more preferably so as to be in the range of 3,000 to 30,000.

As a method of a polymerization reaction, a so-called batch polymerization method where all monomers, a polymerization initiator, and, as needs arise, a chain transfer agent are dissolved in a polymerization solvent and heated to a polymerization temperature; an initiator addition method where, after monomers are dissolved in a solvent and heated to a polymerization temperature, a polymerization initiator is added; and a dropwise addition polymerization method where monomers, a polymerization initiator and a chain transfer agent are partially or all mixed or independently dropped in a polymerization system heated to a polymerization temperature can be applied. Among these, the dropwise addition method is preferable to make differences between lots smaller, and, in particular, in viewpoint of stably retaining undropped monomer during dropping, a method where monomers and a polymerization initiator are separately retained and dropped is preferable.

The solvent that is used in the polymerization reaction is not particularly restricted, as far as it can stably dissolve raw material monomers, an obtained copolymer, a polymerization initiator and a chain transfer agent. Specific examples of the polymerization solvent include ketones such as acetone, methyl ethyl ketone, methyl amyl ketone, cyclohexanone and so on; ethers such as tetrahydrofuran, dioxane, glyme, propylene glycol monomethyl ether and so on; esters such as ethyl acetate, ethyl lactate and so on; ether esters such as propylene glycol methyl ether acetate and so on; and lactones such as γ-butyrolactone. These can be used singularly or in a combination thereof. A usage amount of the polymerization solvent is not particularly restricted. However, the usage amount thereof is, to one part by weight of the monomer, normally in the range of 0.5 to 20 parts by weight and preferably in the range of 1 to 10 parts by weight. When the usage amount of the solvent is too small, in some cases, the monomer precipitates or the viscosity becomes too high to be incapable of maintaining a polymerization system homogeneous. On the contrary, when the usage amount of the solvent is too much, in some cases, the conversion rate of the monomer becomes insufficient or a molecular weight of the copolymer cannot be heightened to a desired value.

A polymerization reaction condition is not particularly restricted. In general, a reaction temperature is preferably in the range of substantially 40 to 100° C. In order to make differences of a copolymer between lots of the copolymer smaller, a polymerization temperature is necessarily controlled severely, that is, preferably controlled within a setting temperature ±1° C. As to a reaction time, in the case of the dropwise addition polymerization, since when a dropping time is longer, a monomer composition and concentration and a radical concentration in the system can be maintained constant, a composition and a molecular weight of a polymer generated during dropping preferably tend to be homogeneous. On the other hand, a longer dropping time unfavorably lowers the production efficiency per unit hour and disturbs the stability of the monomer during dropping. Accordingly, the dropping time is selected between 0.5 to 20 hr and preferably between 1 to 10 hrs. After the dropping comes to completion, since unreacted monomer remains, for a constant time, a polymerization temperature is preferably maintained to age. An aging time is less than 8 hrs and preferably selected between 1 to 6 hrs. In the case of the batch polymerization, an aging time after a polymerization temperature is attained is selected between 1 to 24 hrs and preferably between 2 to 12 hrs.

Since a copolymer obtained by polymerization contains low molecular weight impurities such as an unreacted monomer, oligomer, polymerization initiator and chain transfer agent and reaction byproducts thereof, these have to be removed by refining. Specifically, a polymerization reaction solution, after as needs arise adding a good solvent to dilute, is brought into contact with a poor solvent to precipitate the copolymer as a solid, and thereby the impurities are extracted in a poor solvent phase (hereinafter, referred to as "reprecipitation") or a polymerization reaction solution is rendered liquid-liquid two-phases to extract the impurities in a solvent phase. When the reprecipitation is conducted, further purification can be applied by a step where after the precipitated solid is separated from the solvent by filtration, decantation or the like, the resulting solid is redissolved by a good solvent, followed by further adding a poor solvent thereto to reprecipitate, or by a step where the precipitated solid is washed with a poor solvent or a solvent mixture of poor solvent and good solvent. When the liquid-liquid two-phase separation is conducted, further precipitation can be applied by separating the poor solvent phase by phase separation, followed by adding a poor solvent or a solvent mixture of poor solvent and good solvent to the obtained copolymer solution to reprecipitate or separate in liquid-liquid two-phase. These operations may be conducted by repeating the same operation or by combining different operations.

In the refining step, the copolymer and the impurities are separated by use of the difference of the solubility to the solvent. However, since a low molecular weight region of the copolymer is small in the difference of the solubility particularly from the impurities, the low molecular weight region is partially extracted together with the impurities. In particular, in the case of a copolymer for semiconductor lithography, which is obtained by copolymerizing a plurality of monomers different in the polarity, depending on the polarity of the poor solvent, a composition of an extracted low molecular weight copolymer is different. That is, when a polar poor solvent is used, a low molecular weight copolymer high in a high polarity repeating unit composition is extracted, and, when a non-polar poor solvent is used, a low molecular weight copolymer high in a low polarity repeating unit composition is extracted.

Accordingly, a method of producing a copolymer for semiconductor lithography, which is a copolymer according to the invention and obtained by copolymerizing a monomer having a hydroxyl group and a monomer having no hydroxyl group and where a molar composition of a hydroxyl group-containing repeating unit in a low molecular weight region corresponding to an area of 5% of a copolymer total peak in the GPC is within ±10% of an average molar composition of the hydroxyl group-containing repeating unit in a whole of the copolymer preferably includes a step of bringing a copolymer obtained by polymerizing into contact with a polar solvent having a hydroxyl group to reprecipitate or wash; and a step of bringing the obtained copolymer into contact with a nonpolar solvent having no hydroxyl group to reprecipitate or wash. When the step of bringing into contact with a polar solvent having a hydroxyl group is applied singularly, a composition of the hydroxyl group-containing repeating unit in a low molecular weight region becomes unfavorably low and, on the other hand, when the step of bringing into contact with a polar solvent having no hydroxyl group is applied singularly, a composition of the hydroxyl group-containing repeating unit in a low molecular weight region becomes unfavorably high.

In the invention, typical examples of a polar solvent having a hydroxyl group include compounds having an alcoholic hydroxyl group such as water, methanol, ethanol, isopropanol, ethylene glycol, ethyl lactate and so on and typical examples of a nonpolar solvent having no hydroxyl group include linear, branched and alicyclic hydrocarbons such as pentane, n-hexane, iso-hexane, n-heptane, cyclopentane, methyl cyclohexane and soon; or aromatic hydrocarbons such as toluene, xylene and so on. These solvents can be used singularly or in a mixture thereof. Furthermore, the polymerization solvents and solvents exemplified in the coating film forming solvent described below can be mixed and used as well.

A kind and an amount of the poor solvent (polar solvent having a hydroxyl group and nonpolar solvent having no hydroxyl group) used in the refining are not particularly restricted, as far as a copolymer can be separated from low molecular weight impurities. However, the kind and amount of the poor solvent can be appropriately selected corresponding to the solubility to the poor solvent of the copolymer, a kind and an amount of a solvent used to polymerize, a kind and an amount of the impurity and so on. An amount of the poor solvent is generally, to a total amount of a polymerization reaction solution diluted with a good solvent as needs arise, in the range of 0.5 to 50 times, preferably in the range of 1 to 20 times and more preferably in the range of 2 to 10 times. In all cases, when a usage amount of the solvent is less, impurities such as the unreacted monomer, polymerization initiator, chain transfer agent and reaction byproducts thereof can be insufficiently separated. On the contrary, when the usage amount of the solvent is too much, the waste liquid increases to cause inconvenience from the viewpoint of the workability and the cost.

A temperature of a refining step largely affects on a molecular weight and a molecular weight distribution of a lithography copolymer, the removal rates of the impurities such as residual monomers and the initiator residue and various characteristics in the lithography process; accordingly, the temperature has to be rigidly controlled. When the temperature of the refining step is too low, since the solubility of the impurities to a reprecipitation solvent and a washing solvent becomes insufficient, the impurities are insufficiently removed to be inefficient. On the other hand, when the temperature of the refining step is too high, since the copolymer is eluted in the reprecipitation solvent and the washing solvent, a composition balance in the low molecular weight region of the copolymer may collapse or the yield is unfavorably deteriorated. Accordingly, the refining step is carried out at a temperature in the range of 0 to 40° C. and preferably in the range of 0 to 30° C.

Thus refined copolymer can be taken out as powder after drying or as a solution by charging in a good solvent before or after drying to redissolve. As a good solvent that is used to redissolve, ones cited as the polymerization solvent can be similarly used. A redissolved solution is preferably passed through a filter having an average pore diameter preferably of 0.5 μm or less and more preferably of 0.1 μm or less to remove minute solid content, insoluble foreign matters or metals, or the like.

The refined copolymer solution can be finished into a coating film forming solution by further distilling away other solvents used in the refining step under reduced pressure while supplying a coating film forming solvent. As a solvent for forming a coating film is not particularly restricted. However, normally, the solvent for forming a coating film is selected by taking a boiling temperature, an effect on a semiconductor substrate or other coating films and absorption of radiation used in the lithography into consideration. Examples of the solvent generally used to form a coating film include solvents such as propylene glycol methyl ether acetate, ethyl lactate, propylene glycol monomethyl ether, methyl amyl ketone, γ-butyrolactone, cyclohexanone and soon. A usage amount of the solvent is not particularly restricted and is normally in the range of 1 to 20 parts by weight to one part by weight of the copolymer.

When a copolymer is used in a resist, to the coating film forming solution, a radiation-sensitive acid generator and an acid diffusion inhibitor such as a nitrogen-containing compound or the like, which inhibits acid from diffusing into a portion that has not been exposed to radiation can be further added to complete a resist composition. As the radiation-sensitive acid generator, ones that are generally used as resist raw materials such as an onium salt compound, a sulfone compound, a sulfone acid ester compound, a sulfone imide compound, a disulfonyldiazomethane compound and so on can be used. Furthermore, to the resist composition, as needs arise, compounds used to be used as resist additives such as a dissolution inhibitor, a sensitizer, a dye and so on can be further added. A blending ratio of each of the components (excluding the resist solvent) in the resist composition is, though not particularly restricted, generally selected in the range of 5 to 50 mass percent for the polymer concentration, in the range of 0.1 to 10 mass percent for the radiation-sensitive acid generator and in the range of 0.001 to 10 mass percent for the acid diffusion inhibitor.

Furthermore, when the obtained copolymer is used as an antireflection film, the polymer is used singularly or blended with bifunctional or more isocyanate, amine, epoxide or the like capable of crosslinking between polymers.

EXAMPLE

In what follows, the invention will be detailed with reference to examples. However, the invention is not restricted to the examples. An average copolymer composition (average molar composition of a repeating unit) of the obtained copolymer was obtained from a measurement of $^{13}$C-NMR. Furthermore, a weight average molecular weight Mw, a degree of dispersion Mw/Mn and a residual monomer concentration were obtained from measurements by gel permeation chromatography (GPC). A copolymer composition in each of the molecular weights (molar composition of a repeating unit) was obtained by GPC-IR. A pattern evaluation of the obtained copolymer was carried out with a 248 nm exposing device.

(1) Average Copolymer Composition of Copolymer

Into 20 parts by weight of heavy acetone, 10 parts by weight of a copolymer and one parts by weight of chromium (III) acetylacetonate were dissolved to prepare a sample solution. The sample solution was charged in an NMR tube followed by analyzing by $^{13}$C-NMR (at 400 MHz, manufactured by Bruker).

(2) Mw and Mw/Mn of Copolymer

In 100 parts by weight of tetrahydrofuran (hereinafter, referred to as THF), 4 parts by weight of the copolymer were dissolved to prepare a sample solution. In a GPC unit (trade name: GPC8220, manufactured by Tosoh Corporation) with GPC columns (trade name: KF-804L×4, manufactured by SHOWA DENKO KK), 20 μL of the sample solution was charged with THF as an elution solution, and an eluted solution was detected with a differential refractive index (RI) detector. The Mw and Mw/Mn were calculated based on a calibration curve prepared in advance with standard polystyrene.

(3) Copolymer Composition in Low Molecular Weight Region Corresponding to 5% of Copolymer Peak in GPC In a GPC unit (trade name: GPC8220, manufactured by Tosoh Corporation) with GPC columns (trade name: KF-804L×4, manufactured by SHOWA DENKO KK), 150 μL of the sample solution prepared in (2) was charged with THF as an elution solution, and an eluted solution was introduced in a LC-Transform Model 410 (trade name, manufactured by Lab Connections) and, under heating at 110° C., sprayed onto a germanium disc rotating at a constant speed. The disc was set to a rotating stage of a FT-IR optical module and, by use of FT-IR (trade name, manufactured by JEOL. Ltd.), while rotating the disc, infrared absorption of the copolymer coated on the disc was measured at 100 points. Based on the results and the $^{13}$C-NMR analysis results, a composition of a hydroxyl group-containing repeating unit in a low molecular weight region corresponding to 5% of a copolymer peak in GPC was obtained. In what follows, examples of calculations are shown. Without restricting to examples below, of other copolymers as well, a composition of a hydroxyl group-containing repeating unit in a low molecular weight region corresponding to 5% of a copolymer peak in GPC can be obtained.

Calculation Example 1

Hydroxystyrene-Alkyl Acrylate Copolymer

With a hydroxystyrene composition obtained by $^{13}$C-NMR as $N_{OH}$(%), an alkylacrylate composition as $N_E$, peak areas of a hydroxyl group and a carbonyl group of acrylic acid ester in a FT-IR analysis at each of respective points of a region corresponding to the copolymer as $A_{OH}$ and $A_E$, and sum totals of all points of a region corresponding to the copolymer as $\Sigma A_{OH}$ and $\Sigma A_E$, a repeating unit concentration (expressed as $C_{OH}$) derived from hydroxystyrene in each of the points, a repeating unit concentration (expressed as $C_E$) derived from alkyl acrylate, and a copolymer concentration (expressed as $C_P$) can be calculated by formulas below.

$$C_{OH}=N_{OH}\times(A_{OH}/\Sigma A_{OH}) \, (\%) \qquad \text{(Formula 1)}$$

$$C_E=N_E\times(A_E/\Sigma A_E) \, (\%)$$

$$C_P=C_{OH}+C_E(\%)$$

When a low molecular weight region corresponding to 5% of a copolymer peak in GPC is set up to a point where a total of $C_P$ from the lowest molecular weight of the copolymer is 5% to a point where a sum total of $C_P$s of all points in a region corresponding to the copolymer and a concentration of the hydroxyl group-containing repeating unit and a copolymer concentration in the region, respectively, are expressed with $\Sigma_{5\%}C_{OH}$ and $\Sigma_{5\%}C_P$, difference (expressed with $D_{OH}$) between the low molecular weight region of the hydroxyl group-containing repeating unit and an average composition is calculated by a formula below.

$$D_{OH}=[\{(\Sigma_{5\%}C_{OH}/\Sigma_{5\%}C_P)/N_{OH}\}-1]\times 100(\%) \qquad \text{(Formula 2)}$$

Calculation Example 2

Hydroxyl Group-Containing Acrylate-Lactone-Containing Acrylate-Alkyl Acrylate Copolymer When a hydroxyl group-containing acrylate composition obtained by $^{13}$C-NMR is expressed with $N_{OH}$ (%), peak areas of a hydroxyl group and a carbonyl group of acrylic ester in a FT-IR analysis at each of points of a region corresponding to a copolymer, respectively, are expressed with $A_{OH}$ and $A_E$ and sum totals of all points of a region corresponding to the copolymer, respectively, are expressed with $\Sigma A_{OH}$ and $\Sigma A_E$, a concentration of the hydroxyl group-containing acrylate (expressed with $C_{OH}$) and a copolymer concentration (expressed with $C_P$) at each of points are calculated by formulas below.

$$C_{OH}=N_{OH}\times(A_{OH}/\Sigma A_{OH}) \, (\%)$$

$$C_P=A_E/\Sigma A_E \, (\%) \qquad \text{(Formula 3)}$$

When a low molecular weight region corresponding to 5% of a copolymer peak in GPC is set up to a point where a total of $C_P$ from the lowest molecular weight of the copolymer is 5% to a sum total of $C_P$s of all points in a region corresponding to the copolymer and a concentration of the hydroxyl group-containing repeating unit and a copolymer concentration in the region, respectively, are expressed with $\Sigma_{5\%}C_{OH}$ and $\Sigma_{5\%}C_P$, difference (expressed with $D_{OH}$) between the low molecular weight region of the hydroxyl group-containing repeating unit and an average composition is calculated by a formula below.

$$D_{OH}=[\{(\Sigma_{5\%}C_{OH}/\Sigma_{5\%}C_P)/N_{OH}\}-1]\times 100(\%) \qquad \text{(Formula 4)}$$

(4) Evaluation of Resist Pattern

To a 15% by weight PGMEA solution that includes 60 parts by weight of a copolymer and 360 parts by weight of PGMEA, 1.0 parts by weight of trifluoromethanesulfonic acid triphenylsulfonium as a photoacid generator and 0.1 parts by weight of triethanolamine were added and dissolved, followed by filtering with a 0.05 μm membrane filter, and thereby a resist composition was prepared. The resist composition was spin coated on a Si wafer, dried on a hotplate at 120° C. for 90 sec, and thereby a resist thin film having a film thickness of 500 μm was prepared. The resist thin film was exposed with a KrF excimer laser stepper (NA=0.6, manufactured by Nikon Corporation), immediately thereafter followed by baking at 120° C. for 90 sec, further followed by developing with a 2.38% by weight tetramethylammonium hydroxide aqueous solution at room temperature for 60 sec, still further followed by rinsing with pure water to obtain a resist pattern. An optimum exposure amount for obtaining a 200 nm line and space pattern (1:1) was obtained and this was taken as the optimum exposure amount. Furthermore, a pattern shape at that time was observed with a scanning electron microscope (SEM). The sensitivity and observation results of pattern shapes are summarized in Table 1.

Example 1

In a monomer solution preparation tank maintained in a nitrogen atmosphere, 158 kg of a p-ethylphenol solution containing 24% of p-hydroxystyrene (hereinafter referred to as "PHS"), 23% of methanol and 10% of water, 19.0 kg of tert-butyl acrylate and 1.5 kg of AIBN were charged and dissolved, thereby a monomer solution was prepared. To a polymerization tank, 35 kg of the monomer solution was transferred, followed by heating to 80° C. under stirring, further followed by feeding a remaining monomer solution into the polymerization tank kept at 80° C. over 2 hrs to polymerize. After the completion of the feeding, the monomer solution was aged for 2 hrs with a polymerization temperature kept at 80° C., followed by cooled to room temperature. The obtained polymerization solution was dropped in 620 kg of toluene to precipitate a polymer, followed by removing a supernatant solution. In the next place, the polymer was dissolved with 36 kg of methanol, followed by reprecipitating in 620 kg of toluene, further followed twice by removing a supernatant solution, followed by redissolving in 90 kg of methanol. Furthermore, 55 kg of water was added to reprecipitate, followed by removing a supernatant solution, further followed twice by redissolving in 90 kg of methanol, and an obtained methanol solution was passed through a filter 40QSH (trade name, manufactured by Cuno Incorporated). A filtered methanol solution is partially sampled and dried in a reduced pressure dryer, and an obtained pale yellow solid was analyzed with $^{13}$C-NMR and GPC-IR to obtain an average composition, Mw and Mw/Mn of a copolymer and a copolymer composition in a low molecular weight region corresponding to 5% of a copolymer peak. Furthermore, with a remaining methanol solution heating under reduced pressure to drive away a low boiling temperature solvent such as methanol, propylene glycol methyl ether acetate (hereinafter referred to as "PGMEA") was charged, and thereby a PGMEA solution containing 15% of the copolymer was prepared. Thereafter, according to a method described in the (4), a resist composition was prepared, followed by evaluating a resist pattern. Results are shown in Table 1.

Example 2

Except that, in place of 19.0 kg of tert-butyl acrylate and 1.5 kg of AIBN in example 1, 20.5 kg of 1-ethyl-1-cyclopentyl acrylate and 2.2 kg of AIBN were used, similarly to example 1, a copolymer was obtained, and an average composition, Mw and Mw/Mn of a copolymer and a copolymer composition in a low molecular weight region corresponding to 5% of a copolymer peak were analyzed and a resist pattern was evaluated. Results are shown in Table 1.

Example 3

In a raw material preparation tank maintained in a nitrogen atmosphere, 63.0 kg of methyl ethyl ketone (hereinafter, referred to as "MEK"), 15.6 kg of 5-methacryloyloxy-2,6-norbornane carbolactone (hereinafter, referred to as "NLM"), 17.8 kg of 2-methyl-2-adamantyl methacrylate (hereinafter, referred to as "MAM") and 8.1 kg of 3-hydroxy-1-adamantyl methacrylate (hereinafter, referred to as "HAM") were charged and stirred to dissolve at a temperature in the range of 20 to 25° C., thereby a monomer solution was prepared. Furthermore, in a separate tank kept in a nitrogen atmosphere, 10.0 kg of MEK and 1.0 kg of dimethyl-2,2'-azobisisobutyrate were charged, followed by stirring at a temperature in the range of 10 to 20° C. to dissolve, and thereby an initiator solution was prepared. In a polymerization tank kept in a nitrogen atmosphere, after 24.0 kg of MEK was charged and heated to 80° C. under stirring, the initiator solution kept at room temperature (ca 20° C.) and the monomer solution heated in the range of 25 to 30° C., respectively, were simultaneously began to feed in a polymerization tank kept at 80° C. and fed at constant speeds over 4 hrs. After completion of the feeding, the polymerization temperature was kept at 80° C. to age for 2 hrs, followed by cooling to room temperature, and a polymerization solution was taken out. An obtained polymerization solution was dropped in 420 kg of n-hexane to precipitate a polymer, followed by filtering, and an obtained wet cake was twice repeated to wash with 350 kg of methanol containing 5% by weight of water and filter. The obtained wet cake was partially sampled and dried in a reduced-pressure dryer, and an obtained white powder was analyzed by $^{13}$C-NMR and GPC-IR to obtain an average composition, Mw and Mw/Mn of the copolymer and a copolymer composition in a low molecular weight region corresponding to 5% of a copolymer peak. A remaining wet cake was redissolved in MEK and filtered with a filter 40QSH (trade name, manufactured by Cuno Incorporated), followed by charging PGMEA while driving away MEK by heating under reduced pressure, and thereby a PGMEA solution containing 15% of the copolymer was prepared. Thereafter, similarly to example 1, a resist pattern was evaluated. Results are shown in Table 1.

Example 4

In a raw material preparation tank maintained in a nitrogen atmosphere, 61.0 kg of MEK, 13.3 kg of α-methacryloyloxy-γ-butyrolactone (hereinafter referred to as "GBLM"), 19.7 kg of MAM and 9.0 kg of HAM were charged and stirred at a temperature in the range of 20 to 25° C., thereby a monomer solution was prepared. Furthermore, in a separate tank kept in a nitrogen atmosphere, 11.0 kg of MEK and 1.1 kg of AIBN were charged, followed by stirring at a temperature in the range of 10 to 20° C. to dissolve, and thereby an initiator solution was prepared. In a polymerization tank maintained in a nitrogen atmosphere, 25.0 kg of MEK was charged. Operations after that were carried out similarly to example 3, an average composition, Mw and Mw/Mn of a copolymer and a copolymer composition in a low molecular weight region corresponding to 5% of a copolymer peak were analyzed and a resist pattern was evaluated. Results are shown in Table 1.

Comparative Example 1

Except that in place of, after 55 kg of water is added to reprecipitate and a supernatant solution is discarded, an operation of redissolving with 90 kg of methanol being repeated twice, 540 kg of n-hexane was added to reprecipitate and a supernatant solution was discarded, followed by once redissolving with 90 kg of methanol, operations other than the above were carried out similarly to example 1, and an average composition, Mw and Mw/Mn of a copolymer and a copolymer composition in a low molecular weight region corresponding to 5% of a copolymer peak were analyzed and a resist pattern was evaluated. Results are shown in Table 1.

Comparative Example 2

Except that in place of, after 55 kg of water is added to reprecipitate and a supernatant solution is discarded, an operation of redissolving with 90 kg of methanol being repeated twice, 540 kg of n-hexane was added to reprecipitate and a supernatant solution was discarded, followed by once redissolving with 90 kg of methanol, operations other than the above were carried out similarly to example 2, and an average composition, Mw and Mw/Mn of a copolymer and a copolymer composition in a low molecular weight region corresponding to 5% of a copolymer peak were analyzed and a resist pattern was evaluated. Results are shown in Table 1.

Comparative Example 3

Except that a polymerization solution was dropped not in 420 kg of n-hexane but in 700 kg of methanol containing 5% by weight of water, operations other than that were carried out similarly to example 3, and an average composition, Mw and Mw/Mn of a copolymer and a copolymer composition in a low molecular weight region corresponding to 5% of a copolymer peak were analyzed and a resist pattern was evaluated. Results are shown in Table 1.

Comparative Example 4

The same process as that described in Example 4 was carried out except that a polymerization solution was dropped not in 420 kg of n-hexane but in 700 kg of methanol containing 5% by weight of water, and an average composition, Mw and Mw/Mn of a copolymer and a copolymer composition in a low molecular weight region corresponding to 5% of a copolymer peak were analyzed and a resist pattern was evaluated. Results are shown in Table 1.

and a nonpolar solvent having no hydroxyl group, to reprecipitate or wash the copolymer,
wherein a ratio of the amount of the poor solvent to a total amount of the polymerization reaction solution diluted with the polymerization solvent is 1-20:1, and
wherein a molar composition of a hydroxyl group-containing repeating unit in a low molecular weight region corresponding to 5% of a copolymer total peak by gel permeation chromatography is within ±10% of an average molar composition of hydroxyl group-containing repeating units in a total of the copolymer.

2. The copolymer for semiconductor lithography according to claim 1, wherein the monomer having a hydroxyl group is selected from the group consisting of a hydroxystyrene, a hydroxyhalogenoalkylstyrene, a carboxylic acid having an ethylenic double bond, a hydroxyalkyl ester of carboxylic acid having an ethylenic double bond, and a hydroxyhalogenoalkyl ester of carboxylic acid having an ethylenic double bond.

3. The copolymer for semiconductor lithography according to claim 1, wherein the monomer having no hydroxyl group is a monomer having a hydroxyl group that is protected with a protecting group, wherein the monomer having a hydroxyl group is selected from the group consisting of a hydroxystyrene, a hydroxyhalogenoalkylstyrene, a carboxylic acid having an ethylenic double bond, a hydroxyalkyl ester of carboxylic acid having an ethylenic double bond, and a hydroxyhalogenoalkyl ester of carboxylic acid having an ethylenic double bond, and wherein the protecting group is selected from the group consisting of a saturated hydrocarbon group having 1-20 carbon atoms and an oxygen-containing hydrocarbon group having 2-24 carbon atoms.

4. A semiconductor lithography composition comprising the copolymer for semiconductor lithography according to claim 1.

5. A process for producing a copolymer for semiconductor lithography, wherein said process comprises:
copolymerizing a monomer having a hydroxyl group and a monomer having no hydroxyl group in a polymerization

|  | PHS Composition (mole %) | HAM Composition (mole %) | NLM Composition (mole %) | GBLM Composition (mole %) | TBA Composition (mole %) | ECPA Composition (mole %) | MAM Composition (mole %) |
|---|---|---|---|---|---|---|---|
| Example | 65.4 | | | | 34.6 | | |
| Example | 69.9 | | | | | 30.1 | |
| Example | | 20.8 | 39.7 | | | | 39.5 |
| Example | | 20.3 | | 39.7 | | | 40.0 |
| Comparat | 66.8 | | | | 33.2 | | |
| Comparat | 71.0 | | | | | 29.0 | |
| Camparat | | 20.2 | 39.9 | | | | 39.9 |
| Comparat | | 19.8 | | 39.8 | | | 40.4 |

|  | Mw × 10³ | PD | Sensitivity mJ/cm² | Pattern Shape | Average OH composition (mole %) | 5% area OH composition (mole %) | Deviation (%) |
|---|---|---|---|---|---|---|---|
| Example | 20.3 | 1.99 | 45 | Excellent | 65.4 | 70.3 | 7.5% |
| Example | 14.9 | 1.77 | 40 | Excellent | 69.9 | 72.4 | 3.6% |
| Example | 10.2 | 1.89 | 43 | Excellent | 20.8 | 21.8 | 5.0% |
| Example | 10.3 | 1.84 | 41 | Excellent | 20.3 | 21.7 | 6.9% |
| Comparat | 19.7 | 2.05 | 43 | R-top | 66.8 | 78.4 | 17.4% |
| Comparat | 14.5 | 1.82 | 39 | R-top | 71.0 | 80.2 | 13.0% |
| Camparat | 10.4 | 1.86 | 45 | T-top | 20.2 | 17.0 | −15.5% |
| Comparat | 10.5 | 1.81 | 421 | T-top | 19.8 | 16.4 | −16.9% |

In the table, R-top means that a top shape of a pattern is rounded and T-top means that a top shape of a pattern angulated in T-shape.

The invention claimed is:
1. A copolymer for semiconductor lithography produced by a process comprising:
copolymerizing a monomer having a hydroxyl group and a monomer having no hydroxyl group in a polymerization reaction solution comprising a polymerization solvent to produce the copolymer; and
bringing the copolymer, which is present in the polymerization reaction solution, into contact with a poor solvent comprising: a polar solvent having a hydroxyl group;

reaction solution comprising a polymerization solvent to produce the copolymer; and bringing the copolymer, which is present in the polymerization reaction solution, into contact with a poor solvent comprising: a polar solvent having a hydroxyl group; and a nonpolar solvent having no hydroxyl group, to reprecipitate or wash the copolymer, wherein a ratio of the amount of the poor solvent to a total amount of the polymerization reaction solution diluted with the polymerization solvent is 1-20:1, and wherein a molar composition of a hydroxyl group-containing repeating unit in a low molecular weight region corresponding to 5% of a copolymer total peak by gel permeation chromatography is within ±10% of an average molar composition of hydroxyl group-containing repeating units in a total of the copolymer.

6. The process for producing a copolymer for semiconductor lithography according to claim 5, wherein the monomer having a hydroxyl group is selected from the group consisting of a hydroxystyrene, a hydroxyhalogenoalkylstyrene, a carboxylic acid having an ethylenic double bond, a hydroxyalkyl ester of carboxylic acid having an ethylenic double bond, and a hydroxyhalogenoalkyl ester of carboxylic acid having an ethylenic double bond.

7. The process for producing a copolymer for semiconductor lithography according to claim 5, wherein the monomer having no hydroxyl group is a monomer having a hydroxyl group that is protected with a protecting group, wherein the monomer having a hydroxyl group is selected from the group consisting of a hydroxystyrene, a hydroxyhalogenoalkylstyrene, a carboxylic acid having an ethylenic double bond, a hydroxyalkyl ester of carboxylic acid having an ethylenic double bond, and a hydroxyhalogenoalkyl ester of carboxylic acid having an ethylenic double bond, and wherein the protecting group is selected from the group consisting of a saturated hydrocarbon group having 1-20 carbon atoms and an oxygen-containing hydrocarbon group having 2-24 carbon atoms.

8. A semiconductor lithography composition comprising the copolymer for semiconductor lithography produced by the process according to claim 5.

* * * * *